United States Patent
Haines et al.

(10) Patent No.: US 12,081,011 B2
(45) Date of Patent: Sep. 3, 2024

(54) ARC FAULT CIRCUIT INTERRUPTER

(71) Applicant: Pass & Seymour, Inc., Syracuse, NY (US)

(72) Inventors: Joshua P. Haines, Marcellus, NY (US); Thomas N. Packard, Syracuse, NY (US); Anthony M. Testani, Syracuse, NY (US); Michael F. McMahon, Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 16/616,147

(22) PCT Filed: May 23, 2018

(86) PCT No.: PCT/US2018/034117
§ 371 (c)(1),
(2) Date: Nov. 22, 2019

(87) PCT Pub. No.: WO2018/217883
PCT Pub. Date: Nov. 29, 2018

(65) Prior Publication Data
US 2020/0127452 A1    Apr. 23, 2020

Related U.S. Application Data

(60) Provisional application No. 62/532,141, filed on Jul. 13, 2017, provisional application No. 62/510,202, filed on May 23, 2017.

(51) Int. Cl.
*H02H 1/00* (2006.01)
*G01R 31/52* (2020.01)
(Continued)

(52) U.S. Cl.
CPC ........... *H02H 1/0015* (2013.01); *G01R 31/52* (2020.01); *H01H 71/04* (2013.01); *H02H 3/44* (2013.01)

(58) Field of Classification Search
CPC ........ H02H 1/0015; H02H 3/44; G01R 31/52; H01H 71/04
(Continued)

(56) References Cited

U.S. PATENT DOCUMENTS 3,723,814 A    3/1973   Gross
3,872,355 A    3/1975   Klein et al.
(Continued)

OTHER PUBLICATIONS

Military handbook, Grounding, bonding, and shielding for electronic equipments and facility, vol. 1 of 2 volumes, Basic theory, Dec. 29, 1987 (Year: 1987).*
(Continued)

*Primary Examiner* — Thienvu V Tran
*Assistant Examiner* — Sreeya Sreevatsa
(74) *Attorney, Agent, or Firm* — Bond, Schoeneck & King, PLLC (57) ABSTRACT

An arc fault protective wiring device disposed in an electrical distribution system is disclosed, the device including a pulse frequency digitizer, the pulse frequency digitizer being configured to receive a plurality of pulses, each pulse being representative of an instance that the derivative of the current through a neutral conductor exceeds a first predetermined threshold, the pulse frequency digitizer further being configured to produce a digital signal, the digital signal being representative of the instances at which a frequency of the plurality of pulses exceeds a predetermined threshold; and at least one processor configured to trigger a trip mechanism to electrically decouple a line terminal from a load terminal based, at least in part, on the digital signal.

11 Claims, 6 Drawing Sheets

(51) Int. Cl.
*H01H 71/04* (2006.01)
*H02H 3/44* (2006.01)

(58) Field of Classification Search
USPC .......................................................... 361/42
See application file for complete search history.

(56) References Cited

U.S. PATENT DOCUMENTS

| | | | |
|---|---|---|---|
| 4,159,499 A * | 6/1979 | Bereskin | H02H 3/331 361/45 |
| 4,247,879 A | 1/1981 | Elms et al. | |
| 4,424,439 A | 1/1984 | Payne et al. | |
| 4,507,698 A | 3/1985 | Nilssen | |
| 4,707,759 A | 11/1987 | Bodkin | |
| 4,878,142 A | 10/1989 | Bergman et al. | |
| 5,095,399 A | 3/1992 | Terada et al. | |
| 5,105,325 A | 4/1992 | Lawrence | |
| 5,136,454 A | 8/1992 | Halferty et al. | |
| 5,179,490 A | 1/1993 | Lawrence | |
| 5,682,101 A * | 10/1997 | Brooks | H02H 1/0015 324/520 |
| 5,825,598 A | 10/1998 | Dickens et al. | |
| 5,834,940 A | 11/1998 | Brooks et al. | |
| 5,839,092 A | 11/1998 | Erger et al. | |
| 5,847,913 A | 12/1998 | Turner et al. | |
| 5,886,861 A | 3/1999 | Parry | |
| 5,889,643 A | 3/1999 | Elms | |
| 5,892,195 A | 4/1999 | Aufermann et al. | |
| 5,896,262 A | 4/1999 | Rae et al. | |
| 5,905,619 A | 5/1999 | Jha | |
| 5,910,872 A | 6/1999 | Marmonier et al. | |
| 5,925,276 A | 7/1999 | Batliwalla et al. | |
| 5,933,305 A | 8/1999 | Schmalz et al. | |
| 5,933,308 A | 8/1999 | Garzon | |
| 5,940,256 A | 8/1999 | MacKenzie et al. | |
| 5,946,179 A | 8/1999 | Fleege et al. | |
| 5,969,920 A | 10/1999 | Mackenzie | |
| 5,973,896 A | 10/1999 | Nemir | |
| 5,982,593 A | 11/1999 | Kimblin et al. | |
| 5,982,596 A | 11/1999 | Spencer | |
| 5,993,615 A | 11/1999 | Abry et al. | |
| 6,005,758 A | 12/1999 | Spencer et al. | |
| 6,011,399 A | 1/2000 | Matsumaru et al. | |
| 6,014,297 A | 1/2000 | Clarey et al. | |
| 6,025,980 A | 2/2000 | Morron et al. | |
| 6,031,699 A | 2/2000 | Dollar, II et al. | |
| 6,034,611 A | 3/2000 | Brooks et al. | |
| 6,052,046 A | 4/2000 | Ennis et al. | |
| 6,057,997 A | 5/2000 | Mackenzie et al. | |
| 6,072,317 A | 6/2000 | Mackenzie | |
| 6,084,756 A | 7/2000 | Doring et al. | |
| 6,094,043 A | 7/2000 | Scott et al. | |
| 6,115,230 A | 9/2000 | Voigts et al. | |
| 6,128,168 A | 10/2000 | Arnold et al. | |
| 6,141,197 A | 10/2000 | Kim et al. | |
| 6,144,537 A | 11/2000 | Boteler | |
| 6,157,527 A | 12/2000 | Spencer | |
| 6,161,077 A | 12/2000 | Fawcett | |
| 6,175,229 B1 | 1/2001 | Becker et al. | |
| 6,191,589 B1 | 2/2001 | Clunn | |
| 6,194,982 B1 | 2/2001 | Mrenna et al. | |
| 6,195,241 B1 | 2/2001 | Brooks et al. | |
| 6,195,243 B1 | 2/2001 | Spencer | |
| 6,212,049 B1 | 4/2001 | Spencer | |
| 6,215,378 B1 | 4/2001 | Gibson et al. | |
| 6,218,844 B1 | 4/2001 | Wong et al. | |
| 6,225,883 B1 | 5/2001 | Wellner et al. | |
| 6,229,680 B1 | 5/2001 | Shea | |
| 6,232,857 B1 | 5/2001 | Mason, Jr. et al. | |
| 6,233,128 B1 | 5/2001 | Spencer | |
| 6,239,962 B1 | 5/2001 | Seymour et al. | |
| 6,242,993 B1 | 6/2001 | Fleege et al. | |
| 6,246,556 B1 | 6/2001 | Haun et al. | |
| 6,255,923 B1 | 7/2001 | Mason, Jr. et al. | |
| 6,259,246 B1 | 7/2001 | Ward | |
| 6,259,340 B1 | 7/2001 | Fuhr et al. | |
| 6,259,996 B1 | 7/2001 | Haun et al. | |
| 6,262,871 B1 | 7/2001 | Nemir et al. | |
| 6,275,044 B1 | 8/2001 | Scott | |
| 6,285,534 B1 | 9/2001 | Gibson et al. | |
| 6,300,766 B1 | 10/2001 | Schmalz | |
| 6,307,453 B1 | 10/2001 | Wellner et al. | |
| D450,660 S | 11/2001 | Seymour et al. | |
| 6,313,641 B1 | 11/2001 | Brooks | |
| 6,313,642 B1 | 11/2001 | Brooks | |
| 6,329,810 B1 | 12/2001 | Reid | |
| 6,362,629 B1 | 3/2002 | Parker et al. | |
| 6,377,427 B1 | 4/2002 | Haun et al. | |
| 6,388,849 B1 | 5/2002 | Rae | |
| 6,392,513 B1 | 5/2002 | Whipple et al. | |
| 6,400,258 B1 | 6/2002 | Parker | |
| 6,414,829 B1 | 7/2002 | Haun et al. | |
| 6,417,671 B1 | 7/2002 | Tiemann | |
| 6,426,632 B1 | 7/2002 | Clunn | |
| 6,426,634 B1 | 7/2002 | Clunn et al. | |
| 6,433,976 B1 | 8/2002 | Phillips | |
| 6,437,952 B1 | 8/2002 | Suptitz et al. | |
| 6,437,955 B1 | 8/2002 | Duffy et al. | |
| 6,452,767 B1 | 9/2002 | Brooks | |
| 6,456,097 B1 | 9/2002 | Sutherland | |
| 6,456,471 B1 | 9/2002 | Haun et al. | |
| 6,459,273 B1 | 10/2002 | Dollar, II et al. | |
| 6,459,960 B1 | 10/2002 | Shuto et al. | |
| 6,477,021 B1 | 11/2002 | Haun et al. | |
| 6,504,692 B1 | 1/2003 | Macbeth et al. | |
| 6,522,228 B2 | 2/2003 | Wellner et al. | |
| 6,522,509 B1 | 2/2003 | Engel et al. | |
| 6,525,918 B1 | 2/2003 | Alles et al. | |
| 6,532,424 B1 | 3/2003 | Haun et al. | |
| 6,538,862 B1 | 3/2003 | Mason, Jr. et al. | |
| 6,542,056 B2 | 4/2003 | Nerstrom et al. | |
| 6,545,574 B1 | 4/2003 | Seymour et al. | |
| 6,567,250 B1 | 5/2003 | Haun et al. | |
| 6,577,138 B2 | 6/2003 | Zuercher et al. | |
| 6,577,485 B2 | 6/2003 | Reid et al. | |
| 6,590,757 B2 | 7/2003 | Pahl et al. | |
| 6,591,482 B1 | 7/2003 | Fleege et al. | |
| 6,594,125 B2 | 7/2003 | Dollar | |
| 6,614,638 B1 | 9/2003 | Kleemeier | |
| 6,618,229 B2 | 9/2003 | Bax | |
| 6,621,669 B1 | 9/2003 | Haun et al. | |
| 6,621,677 B1 | 9/2003 | Amundsen | |
| 6,625,550 B1 | 9/2003 | Scott et al. | |
| 6,633,824 B2 | 10/2003 | Dollar | |
| 6,639,768 B2 | 10/2003 | Zuercher et al. | |
| 6,650,515 B2 | 11/2003 | Schmalz et al. | |
| 6,650,969 B1 | 11/2003 | Sieleman | |
| 6,658,360 B1 | 12/2003 | Gies et al. | |
| 6,678,131 B2 | 1/2004 | Chapman et al. | |
| 6,678,137 B1 | 1/2004 | Mason, Jr. et al. | |
| 6,683,766 B1 | 1/2004 | Guo et al. | |
| 6,684,134 B1 | 1/2004 | Sieleman | |
| 6,703,842 B2 | 3/2004 | Itimura et al. | |
| 6,710,687 B2 | 3/2004 | Elms et al. | |
| 6,720,872 B1 | 4/2004 | Engel et al. | |
| 6,728,085 B2 | 4/2004 | Dudhwala et al. | |
| 6,731,483 B2 | 5/2004 | Mason et al. | |
| 6,734,682 B2 | 5/2004 | Tallman et al. | |
| 6,744,260 B2 | 6/2004 | Schmalz et al. | |
| 6,747,459 B2 | 6/2004 | Parker et al. | |
| 6,747,856 B1 | 6/2004 | Huber et al. | |
| 6,762,920 B2 | 7/2004 | Parker | |
| 6,772,077 B1 | 8/2004 | Parker et al. | |
| 6,777,953 B2 | 8/2004 | Blades | |
| 6,781,381 B2 | 8/2004 | Parker | |
| 6,782,329 B2 | 8/2004 | Scott | |
| 6,785,104 B2 | 8/2004 | Tallman et al. | |
| 6,798,628 B1 * | 9/2004 | Macbeth | H02H 1/0015 361/42 |
| 6,809,483 B2 | 10/2004 | Alexandrov | |
| 6,822,458 B2 | 11/2004 | Shander | |
| 6,833,713 B2 | 12/2004 | Schoepf et al. | |
| 6,850,073 B2 | 2/2005 | Elms et al. | |
| 6,859,041 B2 | 2/2005 | Styles | |

(56) References Cited

U.S. PATENT DOCUMENTS

| | | | |
|---|---|---|---|
| 6,859,042 | B2 | 2/2005 | Parker |
| 6,867,670 | B2 | 3/2005 | McCormick et al. |
| 6,873,161 | B1 | 3/2005 | Meckler et al. |
| 6,876,203 | B2 | 4/2005 | Blades |
| 6,876,204 | B2 | 4/2005 | Smith |
| 6,882,158 | B2 | 4/2005 | Blades |
| 6,927,579 | B2 | 8/2005 | Blades |
| 6,943,558 | B2 | 9/2005 | Hale et al. |
| 6,980,407 | B2 | 12/2005 | Pellon |
| D515,505 | S | 2/2006 | Lin |
| 7,009,406 | B2 | 3/2006 | Naidu et al. |
| 7,016,172 | B2 | 3/2006 | Escoda |
| 7,023,196 | B2 | 4/2006 | Khan et al. |
| 7,035,066 | B2 | 4/2006 | McMahon et al. |
| 7,038,897 | B2 | 5/2006 | Csanky et al. |
| 7,062,388 | B2 | 6/2006 | Rivers, Jr. et al. |
| 7,068,045 | B2 | 6/2006 | Zuercher et al. |
| 7,068,480 | B2 | 6/2006 | Wong et al. |
| 7,075,310 | B2 | 7/2006 | Mason, Jr. |
| 7,091,723 | B2 | 8/2006 | Simmons |
| 7,106,069 | B2 | 9/2006 | Kim et al. |
| 7,110,864 | B2 | 9/2006 | Restrepo |
| 7,133,267 | B2 | 11/2006 | Potter |
| 7,136,265 | B2 | 11/2006 | Wong et al. |
| 7,142,291 | B2 | 11/2006 | Sarkozi et al. |
| 7,145,757 | B2 | 12/2006 | Shea et al. |
| 7,148,696 | B2 | 12/2006 | Zhou et al. |
| 7,149,066 | B2 | 12/2006 | Elms |
| 7,151,656 | B2 | 12/2006 | Dvorak et al. |
| 7,161,775 | B2 | 1/2007 | Schmalz |
| 7,170,376 | B2 | 1/2007 | Mills et al. |
| 7,187,181 | B2 | 3/2007 | Parker |
| 7,190,561 | B2 | 3/2007 | Pellon et al. |
| 7,190,562 | B2 | 3/2007 | Pellon et al. |
| 7,205,772 | B2 | 4/2007 | Naidu et al. |
| 7,219,023 | B2 | 5/2007 | Banke et al. |
| 7,227,729 | B2 | 6/2007 | Parker et al. |
| 7,242,291 | B2 | 7/2007 | Nicolls et al. |
| 7,245,129 | B2 | 7/2007 | Wajcer et al. |
| 7,253,637 | B2 | 8/2007 | Dvorak et al. |
| 7,253,640 | B2 | 8/2007 | Engel et al. |
| 7,253,996 | B2 | 8/2007 | Elms et al. |
| 7,268,989 | B2 | 9/2007 | Parker et al. |
| 7,282,924 | B1 | 10/2007 | Wittner |
| 7,288,901 | B1 | 10/2007 | Yu et al. |
| 7,305,311 | B2 | 12/2007 | van Zyl |
| 7,307,429 | B1 | 12/2007 | Parker et al. |
| 7,307,820 | B2 | 12/2007 | Restrepo |
| 7,319,574 | B2 | 1/2008 | Engel |
| 7,327,101 | B1 | 2/2008 | Chen et al. |
| 7,337,079 | B2 | 2/2008 | Park et al. |
| 7,345,860 | B2 | 3/2008 | Wong |
| 7,349,188 | B2 | 3/2008 | Zuercher |
| 7,359,168 | B2 | 4/2008 | Elms et al. |
| 7,362,552 | B2 | 4/2008 | Elms |
| 7,362,553 | B2 | 4/2008 | Elms et al. |
| 7,366,622 | B1 | 4/2008 | Nemir |
| 7,368,918 | B2 | 5/2008 | Restrepo |
| 7,391,218 | B2 | 6/2008 | Kojori et al. |
| 7,400,478 | B2 | 7/2008 | Potter |
| 7,400,481 | B2 | 7/2008 | Pellon et al. |
| 7,403,129 | B2 | 7/2008 | Zhou et al. |
| 7,405,522 | B2 | 7/2008 | Stack |
| 7,405,912 | B2 | 7/2008 | Sung |
| 7,408,750 | B2 | 8/2008 | Pellon et al. |
| 7,439,744 | B2 | 10/2008 | Gass et al. |
| 7,440,245 | B2 | 10/2008 | Miller et al. |
| 7,441,173 | B2 | 10/2008 | Restrepo |
| 7,443,172 | B2 | 10/2008 | Fraedrich |
| 7,443,640 | B2 | 10/2008 | Sung |
| 7,443,644 | B2 | 10/2008 | Sung |
| 7,451,012 | B2 | 11/2008 | Wang et al. |
| 7,460,346 | B2 | 12/2008 | Deshpande et al. |
| 7,463,037 | B2 | 12/2008 | Henson et al. |
| 7,463,465 | B2 | 12/2008 | Rivers et al. |
| 7,468,586 | B2 | 12/2008 | Yu et al. |
| 7,471,075 | B2 | 12/2008 | Berland et al. |
| 7,489,138 | B2 | 2/2009 | Yu et al. |
| 7,492,163 | B2 | 2/2009 | Restrepo |
| 7,492,562 | B2 | 2/2009 | Evans |
| 7,499,250 | B2 | 3/2009 | Zhang |
| 7,499,251 | B2 | 3/2009 | Byron |
| 7,518,475 | B2 | 4/2009 | Mills et al. |
| 7,518,840 | B2 | 4/2009 | Elms |
| 7,536,914 | B2 | 5/2009 | Land, III et al. |
| 7,558,033 | B2 | 7/2009 | Zhou et al. |
| 7,570,146 | B2 | 8/2009 | Mills et al. |
| 7,570,465 | B2 | 8/2009 | Beatty, Jr. |
| 7,577,535 | B2 | 8/2009 | Anderson et al. |
| 7,627,400 | B2 | 12/2009 | Dutoya et al. |
| 7,633,727 | B2 | 12/2009 | Zhou et al. |
| 7,633,728 | B2 | 12/2009 | Parker et al. |
| 7,633,729 | B2 | 12/2009 | Oldenburg et al. |
| 7,633,736 | B2 | 12/2009 | Domitrovich et al. |
| 7,636,225 | B2 | 12/2009 | Potter |
| 7,646,572 | B2 | 1/2010 | Mills et al. |
| 7,652,566 | B2 | 1/2010 | Lee et al. |
| 7,656,626 | B2 | 2/2010 | Carton et al. |
| 7,685,447 | B2 | 3/2010 | Parker |
| 7,697,248 | B2 | 4/2010 | Tomimbang |
| 7,701,681 | B2 | 4/2010 | Dooley |
| 7,746,605 | B2 | 6/2010 | Elms et al. |
| 7,750,646 | B2 | 7/2010 | Maity et al. |
| 7,787,113 | B2 | 8/2010 | Aiello et al. |
| 7,796,366 | B2 | 9/2010 | Kilroy et al. |
| 7,806,000 | B2 | 10/2010 | Land, III et al. |
| 7,826,184 | B2 | 11/2010 | Rivers et al. |
| 7,834,637 | B2 | 11/2010 | Kojori et al. |
| 7,864,005 | B2 | 1/2011 | Gouhl et al. |
| 7,864,492 | B2 | 1/2011 | Restrepo |
| 7,865,321 | B2 | 1/2011 | Muthu-Manivannan et al. |
| 7,872,464 | B2 | 1/2011 | Berland et al. |
| 7,880,476 | B1 | 2/2011 | McKenzie |
| 7,898,781 | B2 | 3/2011 | Kawate et al. |
| 7,912,660 | B2 | 3/2011 | Anderson et al. |
| 7,944,654 | B2 | 5/2011 | Scott |
| 7,947,901 | B2 | 5/2011 | Leopold |
| 7,948,719 | B2 | 5/2011 | Xu |
| 7,952,842 | B2 | 5/2011 | Engel |
| 7,952,843 | B2 | 5/2011 | Potter |
| 8,004,283 | B2 | 8/2011 | Mills |
| 8,004,287 | B2 | 8/2011 | Prabhu et al. |
| 8,004,802 | B2 | 8/2011 | Elms |
| 8,008,585 | B2 | 8/2011 | Mills |
| 8,008,865 | B2 | 8/2011 | Stack |
| 8,023,235 | B2 | 9/2011 | Bilac et al. |
| 8,040,644 | B2 | 10/2011 | Hastings et al. |
| 8,054,591 | B2 | 11/2011 | Changali et al. |
| 8,054,592 | B2 | 11/2011 | Rivers, Jr. |
| 8,072,716 | B2 | 12/2011 | Lee |
| 8,089,737 | B2 | 1/2012 | Parker et al. |
| 8,093,904 | B2 | 1/2012 | Ohta et al. |
| 8,098,465 | B1 | 1/2012 | Flegel |
| 8,159,793 | B2 | 4/2012 | Hall et al. |
| 8,164,347 | B2 | 4/2012 | Schroeder et al. |
| 8,169,757 | B2 | 5/2012 | Larson et al. |
| 8,170,816 | B2 | 5/2012 | Changali et al. |
| 8,179,145 | B2 | 5/2012 | Kinsel |
| 8,179,147 | B2 | 5/2012 | Dargatz et al. |
| 8,184,011 | B2 | 5/2012 | Nayak et al. |
| 8,213,138 | B2 | 7/2012 | Dougherty |
| 8,218,274 | B2 | 7/2012 | Hastings |
| 8,228,649 | B2 | 7/2012 | Shea et al. |
| 8,233,254 | B2 | 7/2012 | Prabhu et al. |
| 8,320,090 | B2 | 11/2012 | Rozman et al. |
| 8,325,504 | B2 | 12/2012 | Kammeter et al. |
| 8,373,570 | B2 | 2/2013 | Restrepo |
| 8,395,391 | B2 | 3/2013 | Potter et al. |
| 8,421,473 | B2 | 4/2013 | Shea |
| 8,427,794 | B2 | 4/2013 | Dvorak et al. |
| 8,497,688 | B2 | 7/2013 | Dorr et al. |
| 8,503,148 | B2 | 8/2013 | Schroeder et al. |
| 8,508,233 | B2 | 8/2013 | Eriksson et al. |
| 8,542,021 | B2 | 9/2013 | Scott et al. |

(56) References Cited

U.S. PATENT DOCUMENTS

| | | |
|---|---|---|
| 8,618,811 B2 | 12/2013 | Berland |
| 8,654,487 B2 | 2/2014 | Mikani et al. |
| 8,675,325 B2 | 3/2014 | Beierschmitt et al. |
| 8,717,720 B2 | 5/2014 | Deboer |
| 8,737,033 B2 | 5/2014 | Parker |
| 8,743,513 B2 | 6/2014 | Ward |
| 8,817,431 B2 | 8/2014 | Tomimbang |
| 8,854,066 B2 | 10/2014 | Shea |
| 8,878,563 B2 | 11/2014 | Robbins |
| 8,879,218 B2 | 11/2014 | Tomimbang |
| 8,891,211 B2 | 11/2014 | Dent |
| 8,899,342 B2 | 12/2014 | Chesley |
| 8,929,036 B2 | 1/2015 | Nayak et al. |
| 8,929,038 B2 | 1/2015 | Strobl et al. |
| 8,947,246 B2 | 2/2015 | Aiken |
| 8,958,182 B2 | 2/2015 | Luebke |
| 9,008,978 B2 | 4/2015 | Robbins |
| 9,025,287 B2 | 5/2015 | Privitera et al. |
| 9,042,073 B2 | 5/2015 | Mills |
| 9,043,039 B2 | 5/2015 | Eizips et al. |
| 9,046,588 B2 | 6/2015 | Behrends et al. |
| 9,057,752 B2 | 6/2015 | Luebke et al. |
| 9,136,688 B2 | 9/2015 | Laschinski et al. |
| 9,190,836 B2 | 11/2015 | Dent |
| 9,203,231 B2 | 12/2015 | Samuelson et al. |
| 2012/0119751 A1* | 5/2012 | Scott ............... G01R 31/52 324/536 |
| 2012/0229939 A1* | 9/2012 | Mikani ............ G01R 31/1227 361/55 |

OTHER PUBLICATIONS

International Search Report Form PCT/ISA/220, International Application No. PCT/US2018/034117, pp. 1-19 dated Jan. 10, 2019.
Chinese Office Action, Issued Feb. 4, 2023, Application No. 201880034359.7, pp. 1-8.

* cited by examiner

ARC FAULT CIRCUIT INTERRUPTER

CROSS-REFERENCE TO RELATED APPLICATIONS

This application is a national stage application under 35 U.S.C. 371 based on international patent application PCT/US18/34117 filed on May 23, 2018, which claims the benefit of Provisional Application Ser. No. 62/510202, filed on May 23, 2017, and Provisional Application Ser. No. 62/532141, filed on Jul. 13, 2017.

FIELD OF THE INVENTION

This disclosure is generally related to system and methods for detecting an arc fault.

BACKGROUND

Electrical wiring systems may suffer from arc faults occurring when current arcs outside the confines of the insulated wires or the outlets of the wiring system. Such arcs can occur due to discontinuities in either the line or neutral wires (known as series arc faults) or due to shorts between the line and neutral wires or between the line and ground wires (known as parallel arc faults). Arc faults are dangerous and can cause fires within the structures that the electrical wiring systems are located. It is thus desirable to immediately detect and stop the flow of current through the wiring system when an arc fault occurs in order to minimize the risk of fire.

Detecting arc faults, however, can be difficult because many household appliances—such as vacuum cleaners, electric drills, etc.—create signals that mimic the appearance of an arc fault. These false-positive signals are known as nuisance signals and can cause an arc fault detection system to trip when no arc fault is occurring. It is thus desirable to find ways to distinguish actual arc faults from nuisance signals within an electrical wiring system.

SUMMARY OF THE INVENTION

This disclosure is generally related to a system and method for determining whether an arc fault is occurring, while discriminating against nuisance signals. The system and method may include a pulse frequency digitizer for determining when the frequency of instances that the derivative of the current through a line or neutral conductor exceeds a predetermined threshold, exceeds a predetermined frequency for a predetermined period of time. The system and method may further include a shunt amplifier for determining the magnitude of current flowing through the neutral conductor, using the inherent resistance of a length of the neutral conductor extending between a known point (to which the input of the shunt amplifier connects) to ground. The system and method may determine whether an arc fault is occurring based on the output of either or both the pulse frequency digitizer and the shunt amplifier.

According to an aspect, an arc fault protective wiring device disposed in an electrical distribution system, the device includes a plurality of line terminals comprising at a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; a pulse frequency digitizer, the pulse frequency digitizer being configured to receive a plurality of pulses, each pulse being representative of an instance that the derivative of the current through the conductor exceeds a first predetermined threshold, the pulse frequency digitizer further being configured to produce a digital signal, the digital signal being representative of the instances at which a frequency of the plurality of pulses exceeds a predetermined threshold; and at least one processor configured to trigger a trip mechanism to electrically decouple the at least one of the plurality of line terminal from at least one of the plurality of least one of the plurality of load terminals based, at least in part, on the digital signal.

According to an embodiment, the arc fault protective wiring device further comprises a di/dt detector configured to produce a di/dt signal representative of the derivative of the current through the conductor.

According to an embodiment, the arc fault protective wiring device further comprises a comparator, the comparator being configured to receive the di/dt signal and to output a pulse to the pulse frequency digitizer each time the di/dt signal exceeds the first predetermined threshold.

The wiring device of claim 3, wherein the pulse frequency digitizer comprises an accumulator configured to receive the plurality of pulses and to output an accumulator signal representative of the frequency at which the plurality of pulses were received The wiring device of claim 4, wherein the pulse frequency digitizer further comprises a digitizer configured to output the digital signal when the accumulator signal exceeds a third predetermined threshold, wherein the accumulator signal exceeds the third predetermined threshold when the frequency at which the pulses were received exceeds the second predetermined threshold.

According to an embodiment, the accumulator is a capacitor.

According to an embodiment, the digitizer is a switch.

According to an embodiment, the accumulator is a capacitor in series with an output of the comparator and in parallel with a control terminal of the switch.

According to an embodiment, the arc fault protective wiring device further comprises a high pass filter in a series relationship with the output of the comparator, the high pass filter having a corner frequency equal to or less than a maximum output frequency of the comparator.

According to an embodiment, the arc fault protective wiring device further comprises a shunt amplifier having a first input terminal, the first input terminal being connected at a first point along the neutral conductor between the line-side neutral terminal and the load-side neutral terminal, the first point being positioned such that a detectable voltage, proportional to current flowing through the neutral conductor and as a result of the resistance of the neutral conductor, is present, wherein the shunt amplifier is configured to output a shunt signal having a voltage value proportional to the current through the neutral conductor.

According to an embodiment, the at least one processor is configured to trigger the circuit interrupter to electrically decouple at least one of the plurality of line terminals from the at least one of the plurality of load terminals based, at least in part, on the shunt signal.

According to an another aspect an arc fault protective wiring device disposed in an electrical distribution system, the device includes: a plurality of line terminals comprising at a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; a shunt amplifier having a first input terminal, the first input terminal being connected at a first point along the neutral conductor between the line-side neutral terminal and the load-side neutral terminal, the first point being positioned such that a detectable voltage, proportional to current flowing through the neutral conductor and as a result of the resistance of a length of the neutral conductor, is present, wherein the shunt amplifier is configured to output a shunt signal having a voltage value proportional to the current through the neutral conductor; and at least one processor configured to trigger the circuit interrupter to electrically decouple at least one of the plurality of line terminals from the at least one of the plurality of load terminals based, at least in part, on the shunt signal.

According to an embodiment, the input terminal is placed at the neutral terminal a point that the resistance of the length of the neutral conductor is greater than 1 mOhm.

According to another aspect, a method for detecting an arc fault, includes the steps of: receiving an input current in a line conductor and neutral conductor of a wiring device; find a derivative of the input current; determine the frequency of instances the derivative of the input current exceeds a predetermined threshold; determine whether the frequency of instances exceeds a predetermined frequency and persists for a predetermined period of time; and determine whether an arc fault is occurring based, at least in part, on whether the frequency of instances exceeds the predetermined frequency and persists for a predetermined period of time.

According to an embodiment, the method further includes the steps of: finding a magnitude of the input current through the neutral conductor; determining whether an arc fault is occurring based, at least in part, on the magnitude of the input current through the neutral conductor.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 1:
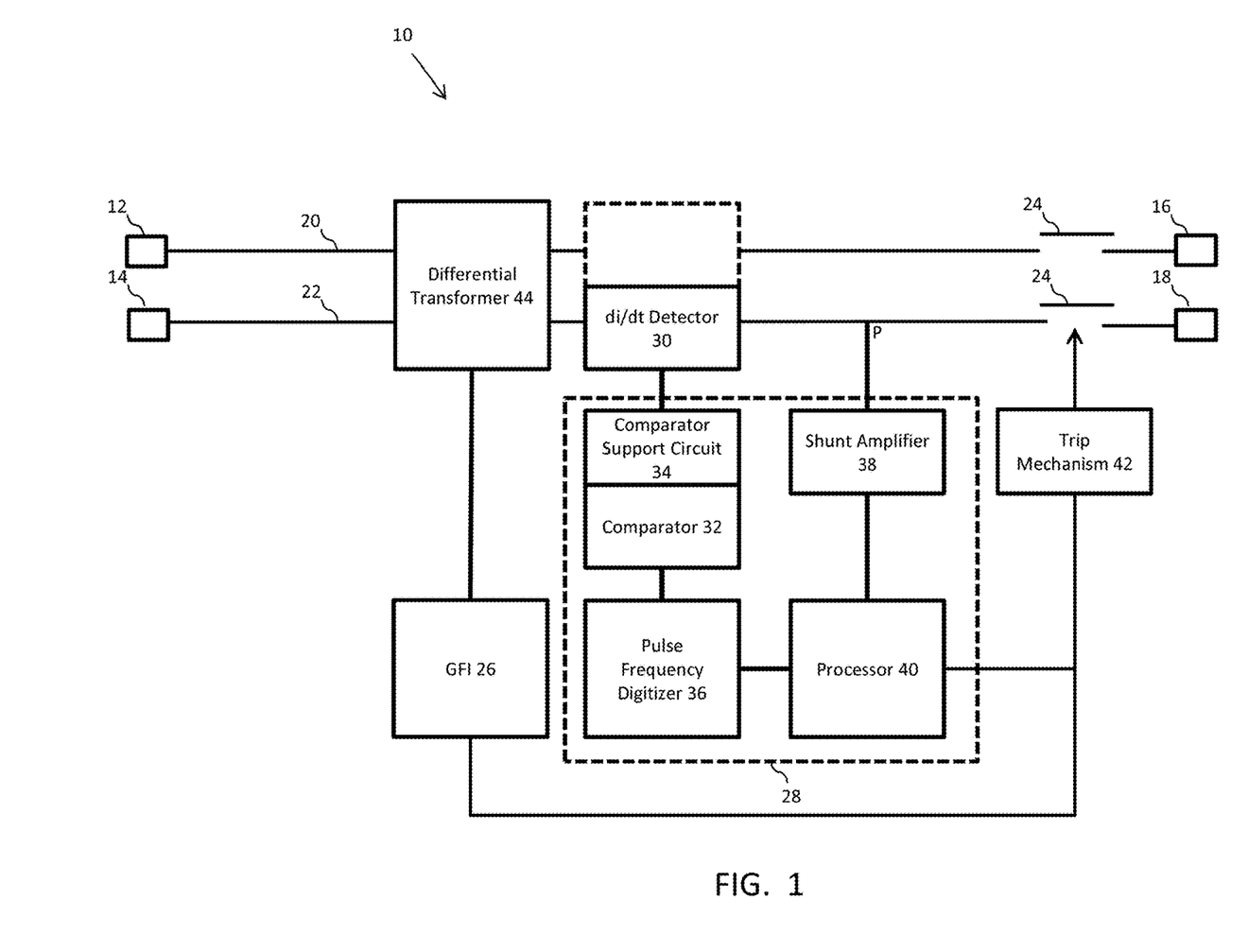
FIG. 1 is a simplified schematic of AFI/GFI wiring device, according to an example.

Reference will now be made in detail to the present exemplary embodiments of the invention, examples of which are illustrated in the accompanying drawings. Wherever possible, the same reference numbers will be used throughout the drawings to refer to the same or like parts. FIG. 1 depicts a simplified schematic representation of an afci/gfci wiring device 10, according to an example. The wiring device 10, as shown, includes line-side terminals comprising a line phase terminal 12 and a line neutral terminal 14. Opposite the line-side terminals are the load-side terminals including load phase terminal 16 and load neutral terminal 18. Line phase terminal 12 is connected to load phase terminal 16 by line conductor 20. Similarly, line neutral terminal 14 is connected to load phase terminal 18 by neutral conductor 22. A pair of separable contacts 24 is respectively positioned along the line conductor 20 and neutral conductor 22 to break the connection between the line-side terminals and the load-side terminals.

Separable contacts 24 are opened when a fault, such as an arc fault or a ground fault, is detected. Whether an arc fault or a ground is occurring is determined by protective Ground Fault Interrupt 26 and Arc Fault Interrupt 28 circuity. As shown, AFI 28 circuitry may communicate with a di/dt detector 30 and comprise a comparator 32 (together with comparator support circuitry 34), a pulse frequency digitizer 36 a shunt amplifier 38, and a processor 40. When AFI 28 circuits detect a fault, trip mechanism 42 is triggered to open the separable contacts 24 and stop the flow of the electricity through the wiring device and to any load or downstream devices.

GFI 26 is on communication with at least one differential transformer 44 to detect current imbalances between the phase 20 and neutral conductor 22, and to trigger trip mechanism 42 upon detection of a current imbalance indicative of a ground fault. Any GFI circuit suitable for detecting such current imbalances may be used. One such GFI circuit is described in US Patent No. 6,522,510 and directed to "Ground Fault Circuit Interrupter with Miswire Protection and Indicator," which is hereby incorporated by reference in its entirety.

At a high level, comparator 32 and pulse frequency digitizer 36 receive a di/dt signal from di/dt detector 30 indicative of the derivative of the current flowing through either the line conductor 20 or neutral conductor 22, and, together, produce a digital output signal representative of the instances that high-frequency current spikes appear on the line conductor 20 or neutral conductor 22 above a predetermined frequency and time. Shunt amplifier 38 monitors a shunt, consisting of a length of the neutral conductor 22 and produces a shunt signal. Both the digital output signal and the shunt signal are fed to processor 40, which, based on either the digital output signal, the shunt signal, or both, triggers trip mechanism 42 to open interrupting contacts 24. Each of the constituent components of the AFI 28 circuit will be discussed in detail below in conjunction with FIGS. 2-4.

Figure 2:
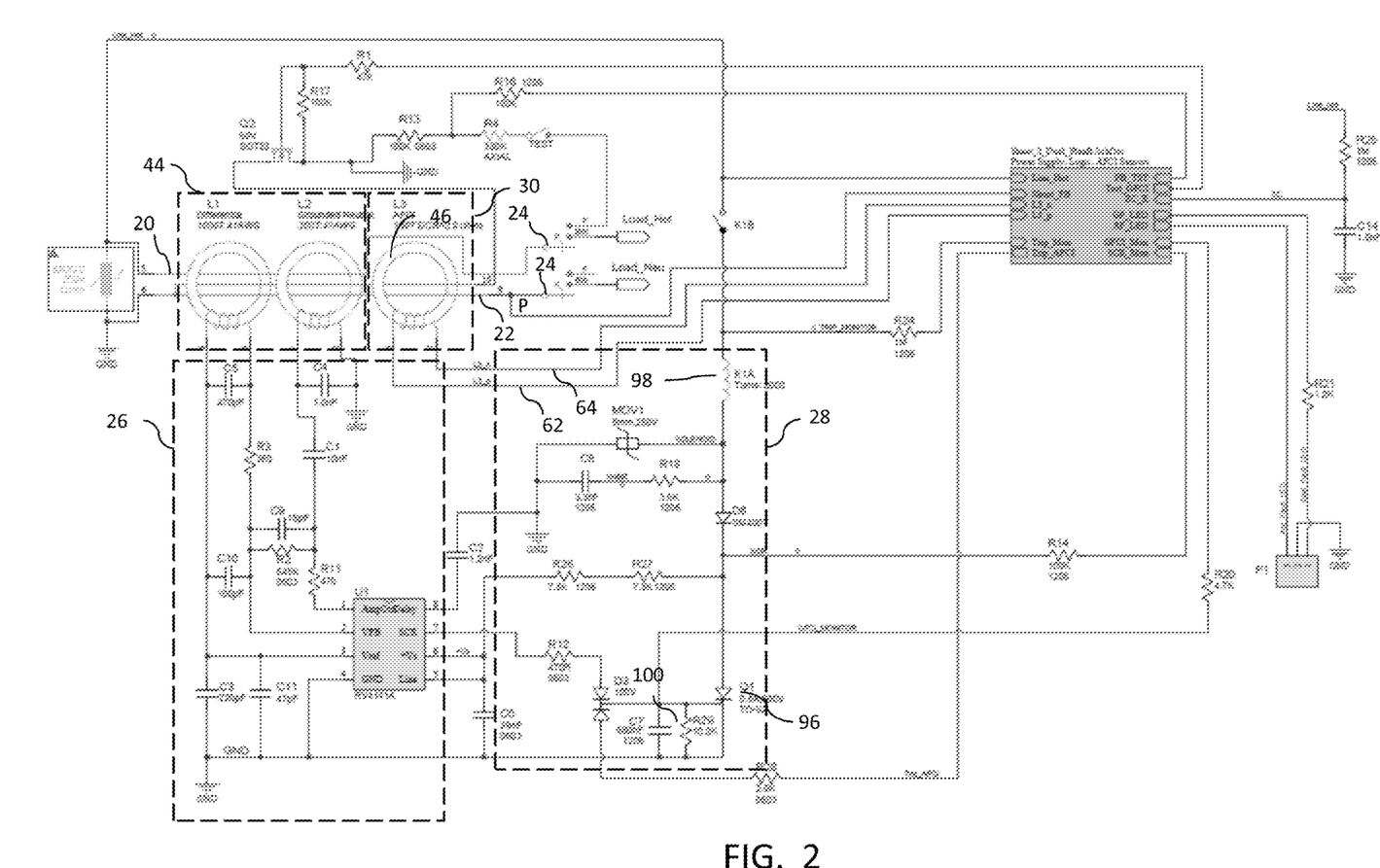
FIG. 2 is a more detailed schematic of the AFI/GFI wiring device, according to an example.

FIGS. 2 and 3 show a more detailed example of the circuit described in connection with FIG. 1. As mentioned above, di/dt detector 30 produces a di/dt signal representative of the derivative through the line conductor 20 or neutral conductor 22. As shown in FIG. 2, di/dt detector 30 may be a toroidal coil 46 disposed in an encircling relation with either the line conductor 20 or neutral conductor 22 of the wiring system (shown, here, in an encircling relation with the neutral conductor). The output of the toroidal coil will be the derivative of the current passing through the line or neutral wires. It will be appreciated that the derivative of the current may be found in other ways besides the toroidal coil.

Returning to FIG. 1, the comparator 32 may compare the derivative of the current received in step 110 to a predetermined voltage (e.g., 50 mV). The comparator 32 will thus output a pulse each time the derivative of the current exceeds the predetermined value. The exact value of the derivative for which the comparator 32 outputs a pulse will be dependent upon the voltage output of the toroidal coil (e.g., number of windings present in the toroidal coil and the value of the current through the wire) and the value of the comparative voltage. The comparator, as depicted in FIG. 3, is implemented in processor 40, although it will be appreciated that the comparator may be implemented in hardware, software, or firmware, as such comparators are known.

A comparator support circuit 34 may be disposed between the input of comparator 32, and the output of di/dt detector 30, to condition the output of di/dt detector 30 for comparator 32. In an example, comparator 32 support circuit may comprise a resistor 50, capacitors 52 and 54, and voltage divider formed of resistors 56, 58, and 60. In an example, resistor 50 may be placed across the outputs 62, 64 of di/dt detector 30 (shown in FIG. 2, for example) to provide resistance for the toroidal coil. Resistor 50 may, for example, be set to 20 K. Capacitors 52, 54 may provide wide-band bypassing for the voltage divider consisting of resistors 56, 58, and 60, and may, for example, have values of 0.01 g and 10 g, respectively. Finally, the voltage divider may condition the voltage supplied to comparator 32. Resistors 56, 58, 60 may, in an example, have values of 2.43 K, 49.9 Ohms, and 2.43 K, respectively.

The output of the comparator 32 may be fed to pulse frequency digitizer 36. Pulse frequency digitizer 36 is configured to receive the pulses from comparator 32 and to generate a digital signal representative of the frequency of instances at which the frequency of the pulses exceeds a predetermined threshold, exceeds a predetermined frequency for a predetermined time.

Figure 3:
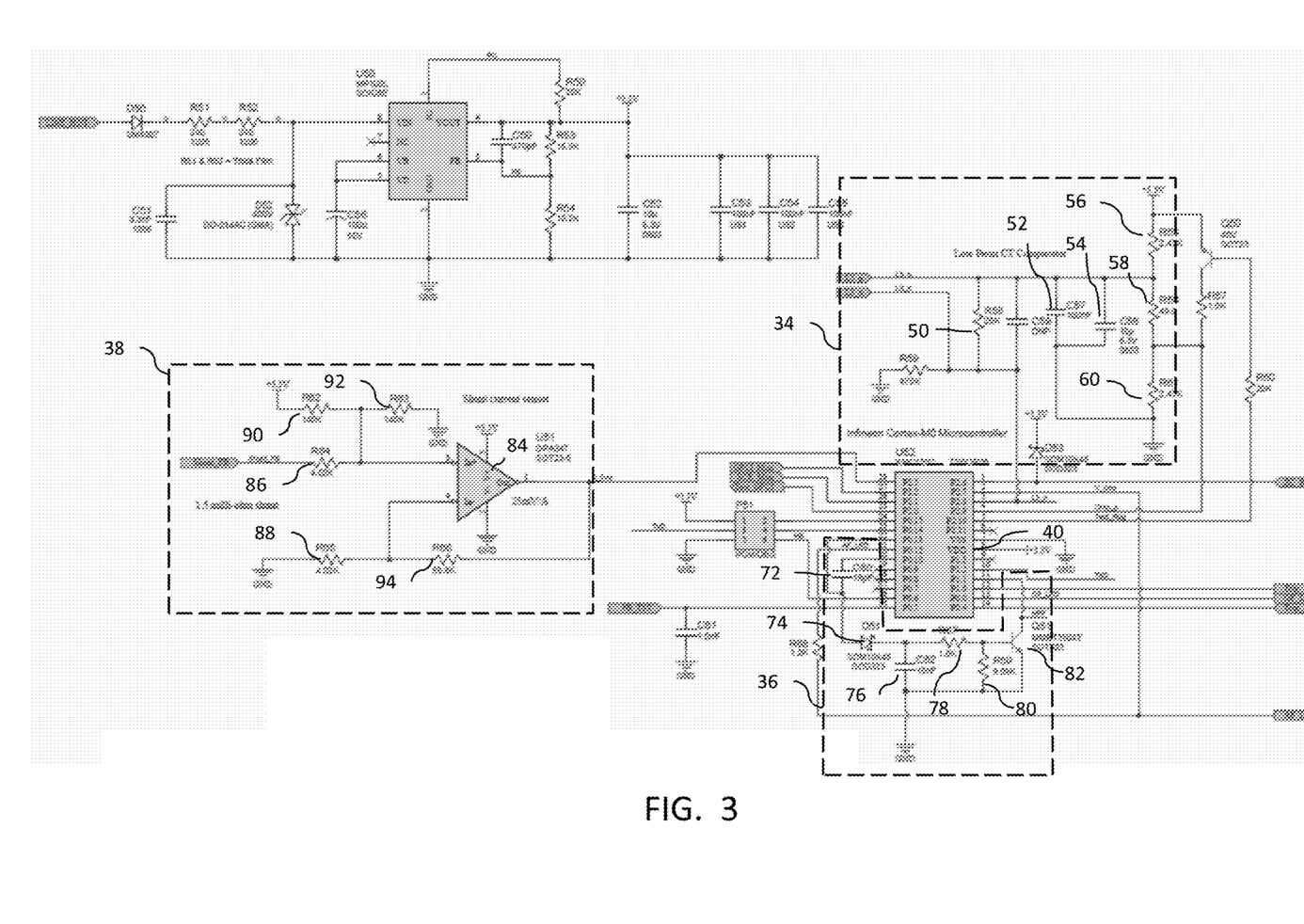
FIG. 3 is a more detailed schematic of the AFI/GFI wiring device, according to an example.
Figure 4:
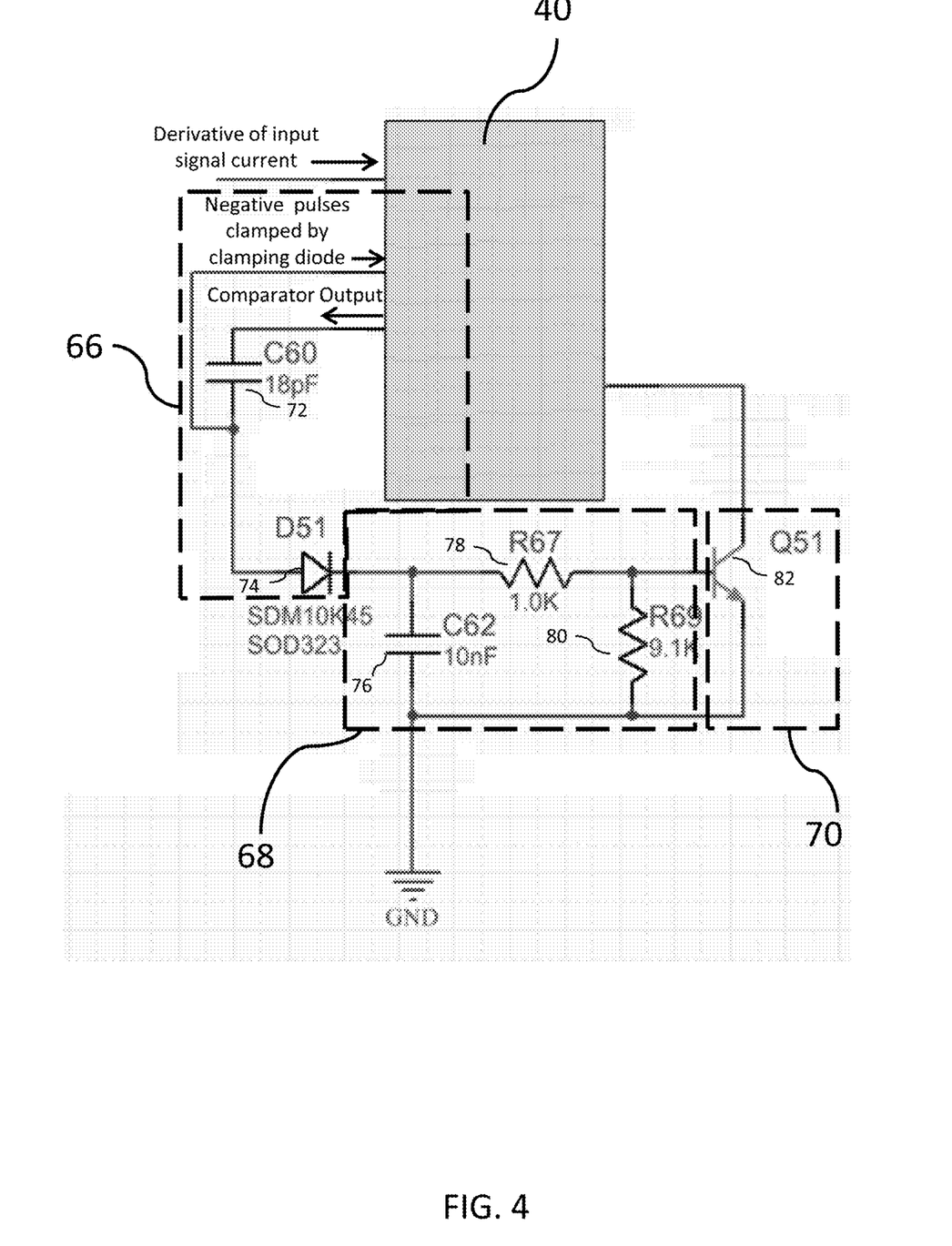
FIG. 4 is a more detailed schematic of a pulse frequency digitizer, according to an example.

FIG. 4 depicts a detailed view of the pulse frequency digitizer 36 shown in FIG. 3. As shown, pulse frequency digitizer 36 may comprise, in an example, a conditioning circuit 66, an accumulator 68, and a digitizer 70. At a high level, conditioning circuit 66 conditions the output of comparator to be processed by accumulator 68 and digitizer 70, and may comprise a high-pass filter 72, for filtering DC and low-frequency comparator outputs, and a diode 74 for permitting only positive pulses. The output of conditioning circuit 66 is received by accumulator 68, which is configured to output a signal representative (e.g., proportional) of the frequency at which comparator 32 generates pulses. Digitizer 70 outputs the digital signal comprising a sequence of discrete high and low values. One of the values of the digital signal, either low or high, will be generated each time the frequency of the received pulses exceeds a predetermined threshold. The other value of the digital signal thus represents the times at which the frequency of received pulses fails to exceed the predetermined threshold. Consequently, the digital signal broadly represents the instances, over time, at which the frequency of the pulses output by comparator exceeds a particular threshold and for a predetermined period of time.

As described above, the output of comparator 32 may be conditioned by capacitor 72 and diode 74. Capacitor 72 functions, in part, as a high-pass filter. Various nuisance loads may produce a fairly constant current rate of change which will result in a substantially DC output of the comparator. Similarly, if processor 40 fails (or, alternately, comparator 32 fails), the output of such a failure mode could result in a substantially DC output. Both of these scenarios—the nuisance load and failure mode of the processor 40—produce substantially DC outputs that are filtered by capacitor 72. The corner frequency of capacitor 72 must thus be selected to ensure that the output of the comparator is not filtered out when arc faults are occurring. This means that the corner frequency of the high-pass filter must be no more than the maximum output frequency of the comparator, determined by the delay propagation of the comparator 32. The corner frequency of the high-pass filter, therefore, must be greater than the maximum output frequency of nuisance loads and less than the maximum output frequency of the comparator. In an example, capacitor 72 may have a value of 18 pF. It will be appreciated that other methods of implementing the high-pass filter may be implemented in conjunction with or instead of capacitor 72.

Diode 74 may further condition the output of the comparator to allow only positive output pulses to charge capacitor 76 (as will be further described below). Negative output pulses will be blocked by diode 74. Diode 74 may, in an example, be a Schottky diode to maximize the voltage possible across capacitor 76. Negative pulses produced by the comparator may be clamped by a negative voltage clamping diode internal to processor. In other examples, such negative voltage clamping diode may be implemented external to processor 40. In yet further examples, diode 74 and the negative voltage clamping diode may not be required, because comparator may be configured to only output positive pulses in response to either positive or negative rates of change or to only positive or only negative rates of change.

Looking again at FIG. 4, accumulator 68 may comprise capacitor 76 and resistors 78, 80. Capacitor 76 is placed in series with the output of comparator 32; thus the higher the frequency of pulses output from comparator 32, the higher the voltage across capacitor 76. Stated differently, the voltage output by accumulator 68 will be proportional to the number of pulses generated by the comparator within a predetermined period of time.

Because the voltage across capacitor 76 will begin to decay any time a pulse is not output from comparator 32, a certain frequency of pulses will be required to retain or increase the voltage across capacitor 76. The minimum frequency for which capacitor 76 will retain a charge will be determined by the size of the capacitor and the values of resistors 78 and 80 (specifically, the decay rate is determined by the product of capacitor 76 and the sum of resistors 78 and 80). A large capacitor will decay more slowly than a small capacitor and will accumulate pulses over a larger period of time. Thus, a lower frequency of pulses will be required to retain a voltage across a large capacitor than small. By contrast, a smaller capacitor will quickly discharge and will therefore require a higher frequency of pulses to retain a charge. By tuning the values of capacitor 76 and resistors 78, 80, the output signal of accumulator 68 may be tailored to achieve a particular value for a specific frequency of pulses, as necessary.

For example, as will be described below, digitizer may be implemented with a switch, such as a BJT or MOSFET. Thus, values of capacitor 76 and resistors 78 and 80 may be tailored such that, at a particular frequency of pulses, the voltage output of accumulator 68 is equal to or greater than the threshold voltage of the switch 82 control node (e.g., the base or gate or switch 82), causing switch 82 to begin conducting.

As an example, capacitor 76 may have a capacitance of 10 nF, resistor 78 may have a resistance of 1 K, and resistor 80 may have a resistance of 9.09 K.

In practice, arc faults result in high frequency pulses in the neutral or line conductor. Accumulator 68 requires that the high frequency data persist for a period of time sufficient to increase the output signal of accumulator (e.g., the voltage across capacitor 76) to a level sufficient to turn switch 82 on. Setting capacitor 76 and resistors 78, 80 to the values described above will require high frequency data to persist out of comparator 32 for at least 250 µs switch 82 to turn on. Conversely, accumulator will ignore bursts of high frequency impulses less than 250 µs, because such bursts will be insufficient to raise the voltage of capacitor 76 above the control terminal of switch 82 above the threshold voltage.

Of course, these pulses may be accumulated in ways other than capacitor 76, and capacitor 76 is merely provided as an example. In another example, accumulator 68 may be implemented with a microprocessor configured to count the output pulses and thus the Turning now to digitizer 70, as described earlier, digitizer may output a digital signal indicative of the instances at which the frequency of the pulses output by comparator 32 exceeds a predetermined frequency. As briefly described above, digitizer 70 may be comprised of a switch 82, such as a MOSFET or a BJT. In the example shown in FIG. 4, capacitor 76 is in parallel with the control terminal of switch 82, and, therefore, the voltage across capacitor 76 is input to the control terminal of switch 80. Thus, to turn on switch 82, pulses must be output from comparator 32 at a high enough frequency and for a sufficient period of time to ensure that a sufficient voltage exists across capacitor 76 to turn on switch 82. If the frequency of pulses from the comparator 32 is too low, or do not persist for a long enough period of time, the voltage across capacitor 76 will not be high enough to turn on switch 82. In this way, nuisance loads that do not produce frequencies of pulses from the comparator higher than a given threshold and for a given length of time may be dismissed.

Because switch 82 is tied to ground, once the output signal of accumulator 68 is high enough to turn on switch 82, the pin of processor 40 tied to the collector of switch 82 will be pulled low (in this example, the pin of processor 40 is otherwise held high due a pull-up resistor disposed within processor 40). Of course, in an alternate example, the transistor may be tied to a voltage source and the same pin of processor 300 may thus be pulled high. (As described above, the voltage necessary to turn on switch 82 may, in an example, be conditioned by a voltage divider network consisting of resistors 78 and 80.)

The output of switch 82 thus signifies when the rate of change of the current, present in the line, exceeds a given threshold a given number of times within a given period of time. This output may be used as part of a larger calculation to determine whether an actual arc fault is occurring in the electrical wiring system.

It will be appreciated that determining whether the frequency of the comparator output exceeds a second threshold for a predetermined period of time may be accomplished in any other suitable way.

Returning to FIG. 1, shunt amplifier 38 is connected to the neutral conductor 22 at point P. Because the neutral conductor has an inherent resistance per unit length, when current is flowing through neutral conductor 22, a voltage $V_{shunt}$ (i.e., a shunt signal) will appear at point P proportional to the value of the current and the resistance of the length of neutral conductor. The resistance of the neutral conductor at point P will be dependent on the distance from point P to ground and the inherent resistance of the neutral conductor per unit length. Point P may be selected such that the voltage resulting from the flow of current through the neutral line results in a detectable output voltage from shunt amplifier 38. As shown in FIG. 2, this length extends from point P to the ground, through the toroidal coils of di/dt detector 30 and differential transformer 44.

In an example, the resistance of neutral line from point P to ground is greater than 1 mOhm. In another example, the resistance of the neutral line from point P to ground is approximately 1.5 mOhm. The length of neutral conductor 22 may be a bus bar or a length of wire and may be comprised any material classified as a conductor such as copper. It should be further understood that the length of neutral conductor from point P to ground should not include a lumped element resistor.

Shunt amplifier 38 may, as shown in FIG. 3, be a non-inverting amplifier 84 configured with a resistive network comprising resistors 86, 88, 90, 92, 94. Resistor 90 may be placed between a DC supply voltage source, here at 3.3 V, and the non-inverting input of amplifier 84. Resistor 90 may form a voltage divider with resistor 92, which is coupled between the non-inverting input of amplifier 84 and ground. Resistor 86 may be coupled between the point P at the neutral conductor 22 and the non-inverting input of amplifier 84. Resistor 88 may be coupled between the inverting input of amplifier 84 and ground. Resistor 88 is thus connected to the ground reference point of the neutral conductor, the same reference point from which point P is measured. Resistor 94 may be coupled between the inverting input of amplifier 84 and the output of amplifier 84.

In example the value of resistor 86 and resistor 88 may be matched, the parallel resistance (i.e., the Thevenin equivalent) of resistors 90 and 92 may be matched to resistor 94. This configuration will result in an amplifier gain of the value of the voltage at point P multiplied by the ratio of resistor 88 and resistor 94. In an example, the resistors may be set to the following values: resistors 86 and 88 may both be set to approximately 4.02 kOhm, resistor 94 may be set to 69.8 kOhm, and resistors 90, 92 may be set to 140 kOhm. Assuming the resistance of the neutral conductor from point P is 1.5 mOhm yields an output of approximately 25 mV/Amp of current flowing through the neutral conductor 22.

This configuration permits detecting the current through the neutral conductor without placing a resistor in series with the conductor. It should be understood that other amplifier topologies and other types of amplifiers may be used to amplify the voltage present at point P of the neutral conductor.

Processor 40 may receive the digital output signal from pulse frequency digitizer 36 and from the shunt signal from shunt amplifier 38 and, based on either the digital output signal, the shunt signal, or both, trigger the trip mechanism 42 to open interrupting contacts. In an example, processor 40 may be a microprocessor 40 capable of receiving digital signal and/or shunt signal, performing at least one analytical process to determine the presence of a fault based on at least one of digital signal and shunt signal, and initiating the trip process to open interrupting contacts 24. In an example, processor 40 may comprise a nontransitory storage medium storing program code for executing instructions to carry out the processes described above. In another example, processor may comprise multiple such storage mediums, and/or may be comprised of a plurality of independent devices that work in concert to achieve the above-described processors.

A detailed view of trip mechanism 42 is depicted in FIG. 2. As shown, trip mechanism 42 may include an SCR 96 and a solenoid 98. When processor 40 determines a fault has occurred, based on at least one of the shunt signal and digital signal inputs, processor 40 outputs a signal to trigger SCR 96, which energizes solenoid 98, opening the interrupting contacts 24. Resistor 100 limits the current into the gate of SCR 96. Interrupting contacts 24 may be implemented as an electromechanical device, and any known interrupting contacts may be used to separate the line terminals from the load terminals. One such set of interrupting contacts, the electromechanical device that supports their operation, is taught in U.S. Pat. No. 9,437,386 directed to a "Protective Wiring Device," the entire disclosure of which is incorporated herein by reference.

Figure 5:
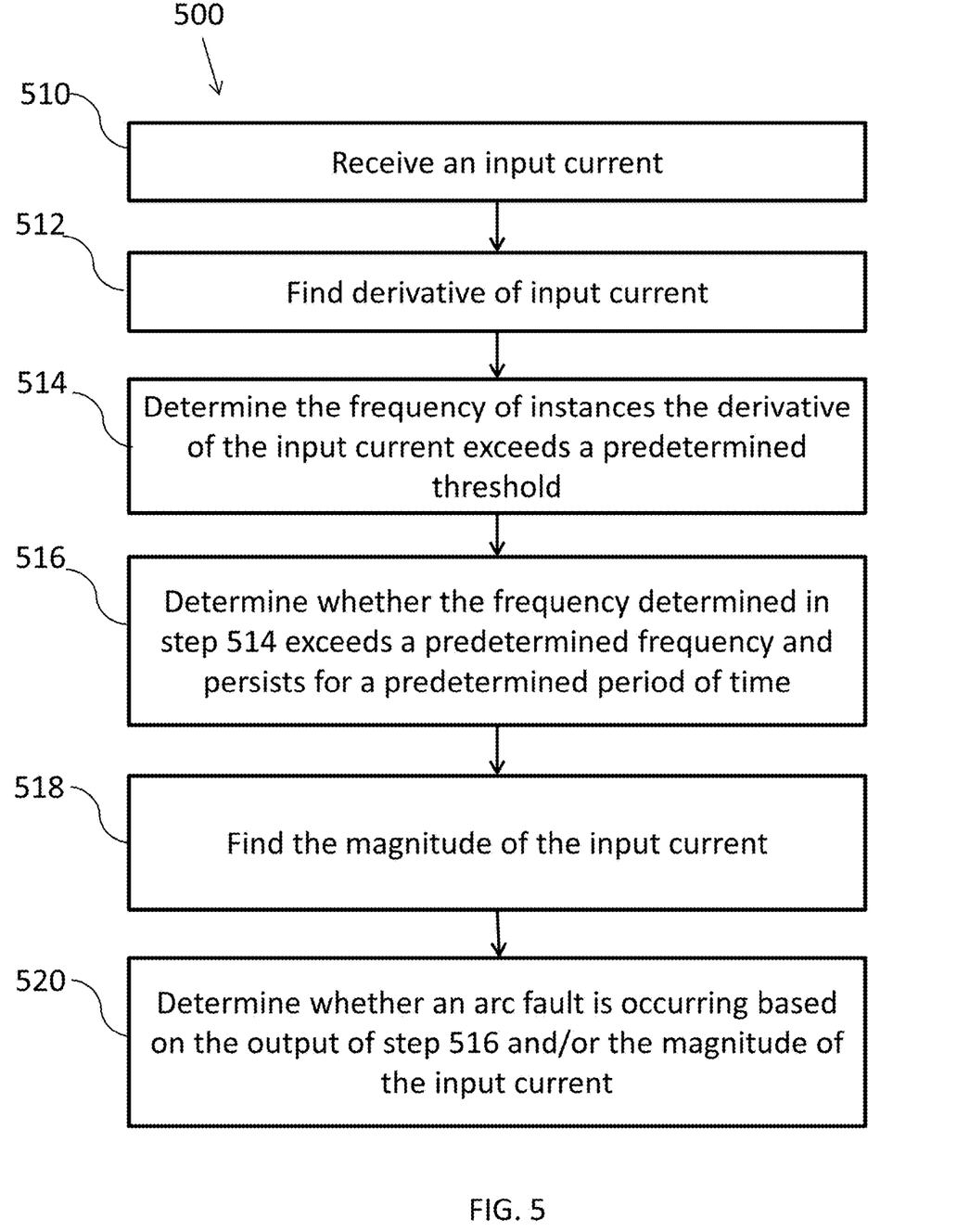
FIG. 5 is a flowchart of a method for detecting arc faults, according to an example.

Turning to FIG. 5, there is shown a method 500 for determining whether an arc fault is likely occurring. The steps of method 500 may be accomplished using the wiring device 10 described above, however, it should be understood that the steps may be accomplished using other devices suitable for carrying out the described steps. For example, the steps of method 500 may be implemented in software, firmware, or hardware. For example, the signal input may be received from either a neutral or line input of an electrical wiring system and may be digitized by, for example, a controller such as a processor, FPGA, ASIC, or other computing device including a non-transitory and programmable storage medium. Whereupon the processor may implement the steps of method 100 (including, for example, steps 200 and 202 as one possible implementation of step 114). In an alternate example, the steps of method 100 may be implemented through hardware or a combination of hardware and software.

Turning to in step 510 an input current is received, the signal may be received, for example, through the line conductor 20 and neutral conductor 22 of a wiring device such as wiring device 10.

At step 512, a derivative of the input current is found. As described above, the derivative may be found using a di/dt detector 30, such as a toroidal coil.

Figure 6:
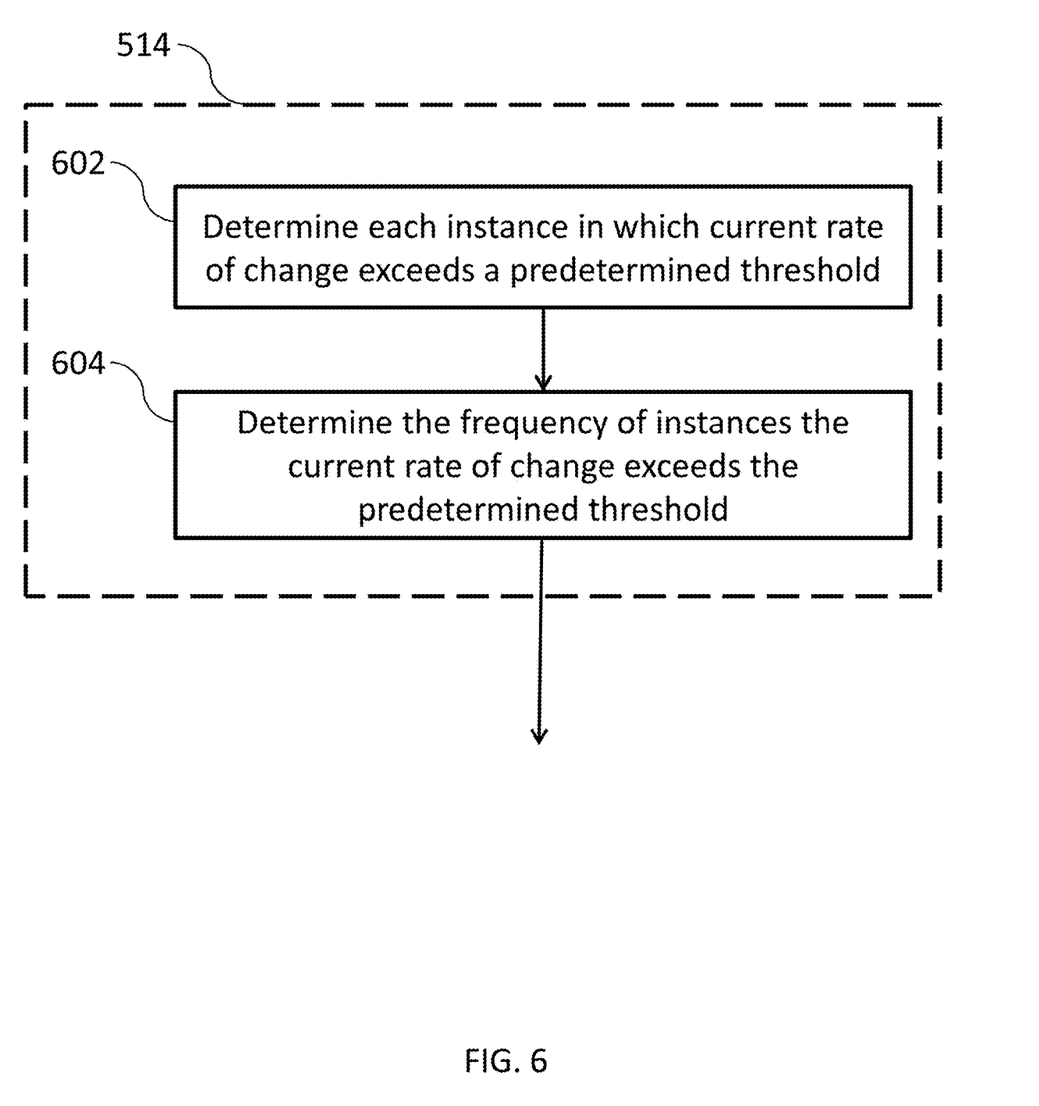
FIG. 6 is a flowchart of a method for detecting arc faults, according to an example.

At step 514, the frequency of instances the derivative of the input current exceeds a predetermined threshold is determined. Step 514 may be accomplished using a combination of comparator 32 and accumulator 68. Specifically, step 514 may be broken into sub steps 602 and 604, shown in FIG. 6. At step 602, each instance in which the current rate of change exceeds a predetermined threshold is determined. Step 602 may be accomplished using, for example, comparator 32, which outputs a pulse each time the derivative of the current input signal exceeds a predetermined threshold. At step 604, the frequency of instances the current rate of change exceeds the predetermined threshold is determined. Step 604 may be accomplished using, for example, the accumulator 68 described above, which outputs a signal proportional to the frequency of pulses output from comparator 32, and thus representative of the frequency the instances of the current rate of change exceeds the predetermined threshold.

Returning to FIG. 5, at step 516, it is determined whether the frequency determined in step 514 exceeds a predetermined frequency and persists for a predetermined period of time. Step 516 may be accomplished using the digitizer 70, which is only triggered when the output signal of the accumulator 68 exceeds a predetermined threshold, representing one instance when the frequency of instances the derivative of the input current exceeded a predetermined threshold exceeded a predetermined frequency and persisted for a predetermined period of time.

At step 518, the magnitude of the input current is found. This step may be accomplished using, for example, the shunt amplifier 38, which is configured to find the magnitude of the current flowing through the neutral conductor, using a length of the neutral conductor from a known point as a resistive shunt.

At step 520, whether an arc fault is occurring is determined based on, at least in part, the output of step 516 and/or the magnitude of the input current. This step may be accomplished, for example, using processor 40 which receives the inputs from both the shunt amplifier 38 and the pulse frequency digitizer 36 and based, at least in part, on the signal from one or both, whether an arc fault exists.

Although a dual afci/gfci embodiment has been shown and described in the figures (e.g., FIGS. 1-4), the circuit may be implemented as only an arc fault protective circuit without the ground fault protective device (indeed, the operations of the arc fault and ground fault circuits are relatively independent and may be separated without difficulty). Furthermore, the afi protective circuit (comprising di/dt detector 30, arc fault circuit 28, together with the trip mechanism 42 and interrupting contacts 24) may be implemented in any wiring application having a neutral conductor from which the derivative of the current may be measured and/or a length of which may be used as a shunt. Such wiring devices may, for example, include a wall receptacle, light switch, etc. Further, variations of the afi protective device, consistent with the device as claimed (e.g., using either but not both the pulse frequency digitizer 36 and the shunt amplifier 38) may be implemented in any wiring device.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An arc fault protective wiring device disposed in an electrical distribution system, the device comprising:
    a plurality of line terminals comprising a line-side phase terminal and a line-side neutral terminal;
    a plurality of load terminals comprising a load-side phase terminal and a load-side neutral terminal;
    a line conductor electrically coupling the line-side phase terminal to the load-side phase terminal;
    a neutral conductor electrically coupling the line-side neutral terminal to the load-side neutral terminal;
    a pulse frequency digitizer, the pulse frequency digitizer being configured to receive a plurality of pulses, each pulse being representative of an instance that a derivative of current through the conductor exceeds a first predetermined threshold, the pulse frequency digitizer further being configured to produce a digital signal, the digital signal being representative of the instances at which a frequency of the plurality of pulses exceeds a second predetermined threshold;
    a shunt amplifier having a first input terminal, the first input terminal being connected at a first point along the neutral conductor between the line-side neutral terminal and the load-side neutral terminal, the first point being positioned such that a detectable voltage, proportional to current flowing through a length of the neutral conductor between the first point and ground and as a result of a resistance of the length of neutral conductor, is present, wherein the shunt amplifier is configured to output a shunt signal having a voltage value proportional to the detectable voltage, wherein the length of the neutral conductor does not include a lumped element resistor; and at least one processor configured to trigger a trip mechanism to electrically decouple the at least one of the plurality of line terminal from at least one of the plurality of load terminals based, at least in part, on determining from the digital signal and the shunt signal that an arc fault is occurring.

2. The arc fault protective wiring device of claim 1, further comprising a di/dt detector configured to produce a di/dt signal representative of the derivative of the current through the conductor.

3. The arc fault protective wiring device of claim 2, further comprising a comparator, the comparator being configured to receive the di/dt signal and to output a pulse to the pulse frequency digitizer each time the di/dt signal exceeds the first predetermined threshold.

4. The arc fault protective wiring device of claim 3, further comprising a high pass filter in a series relationship with the output of the comparator, the high pass filter having a corner frequency equal to or less than a maximum output frequency of the comparator.

5. The arc fault protective wiring device of claim 4, wherein the pulse frequency digitizer further comprises a digitizer configured to output the digital signal when the accumulator signal exceeds a third predetermined threshold, wherein the accumulator signal exceeds the third predetermined threshold when the frequency at which the plurality of pulses were received exceeds the second predetermined threshold.

6. The arc fault protective wiring device of claim 1, wherein the pulse frequency digitizer comprises an accumulator configured to receive the plurality of pulses and to output an accumulator signal representative of the frequency at which the plurality of pulses were received.

7. The arc fault protective wiring device of claim 6, wherein the accumulator comprises a capacitor, wherein the digitizer comprises a switch, wherein the capacitor is in series with an output of a comparator and in parallel with a control terminal of the switch.

8. An arc fault protective wiring device disposed in an electrical distribution system, the device comprising:

a plurality of line terminals comprising a line-side phase terminal and a line-side neutral terminal;

a plurality of load terminals comprising a load-side phase terminal and a load-side neutral terminal;

a line conductor electrically coupling the line-side phase terminal to the load-side phase terminal;

a neutral conductor electrically coupling the line-side neutral terminal to the load-side neutral terminal;

a shunt amplifier having a first input terminal, the first input terminal being connected at a first point along the neutral conductor between the line-side neutral terminal and the load-side neutral terminal, the first point being positioned such that a detectable voltage, proportional to current flowing through a length of the neutral conductor between the first point and ground and as a result of a resistance of the length of the neutral conductor, is present, wherein the shunt amplifier is configured to output a shunt signal having a voltage value proportional to the detectable voltage, wherein the length of the neutral conductor does not include a lumped element resistor; and at least one processor configured to trigger the circuit interrupter to electrically decouple at least one of the plurality of line terminals from the at least one of the plurality of load terminals based, at least in part, on determining from the shunt signal that an arc fault is occurring.

9. The arc fault protective wiring device of claim 8, wherein the first point is positioned such that the resistance of the length of the neutral conductor is greater than 1 mOhm.

10. The arc fault protective wiring device of claim 8, wherein the shunt amplifier has a second input terminal, the second input terminal being electrically connected to a reference point of the neutral conductor.

11. The arc fault protective wiring device of claim 10, wherein the length of the neutral conductor is positioned, and routed through at least one fault sensing component.

* * * * *